US011087042B1

(12) United States Patent
Hussey

(10) Patent No.: US 11,087,042 B1
(45) Date of Patent: Aug. 10, 2021

(54) GENERATION OF A SIMULATION PLAN AND PERFORMANCE OF A SIMULATION BASED ON THE PLAN

(71) Applicant: Wells Fargo Bank, N.A., San Francisco, CA (US)

(72) Inventor: Ben L. Hussey, Des Moines, IA (US)

(73) Assignee: Wells Fargo Bank, N.A., San Francisco, CA (US)

(*) Notice: Subject to any disclaimer, the term of this patent is extended or adjusted under 35 U.S.C. 154(b) by 750 days.

(21) Appl. No.: 15/639,840

(22) Filed: Jun. 30, 2017

(51) Int. Cl.
  *G06F 8/61* (2018.01)
  *G06Q 10/06* (2012.01)
  *G06F 30/20* (2020.01)

(52) U.S. Cl.
  CPC ............... *G06F 30/20* (2020.01); *G06F 8/63* (2013.01); *G06Q 10/06313* (2013.01)

(58) Field of Classification Search
  CPC ............................ G06F 30/20; G06F 17/5009
  USPC .......................................................... 703/22
  See application file for complete search history.

(56) References Cited

U.S. PATENT DOCUMENTS

| | | | |
|---|---|---|---|
| 8,265,980 B2 | 9/2012 | Ochs et al. | |
| 8,359,491 B1 | 1/2013 | Bloomstein | |
| 8,402,236 B2 | 3/2013 | Okada et al. | |
| 8,457,996 B2 | 6/2013 | Winkler et al. | |
| 8,639,793 B2* | 1/2014 | Kapur | G06F 11/203 |
| | | | 709/223 |
| 8,880,960 B1 | 11/2014 | Bergquist et al. | |
| 8,892,707 B2* | 11/2014 | Robinson | G06F 9/45558 |
| | | | 709/223 |
| 8,990,608 B1* | 3/2015 | Gupta | G06F 11/2028 |
| | | | 714/3 |
| 9,092,395 B2 | 7/2015 | Bradfiled et al. | |
| 9,208,007 B2 | 12/2015 | Harper et al. | |
| 9,218,194 B2 | 12/2015 | Brant et al. | |
| 9,300,548 B2 | 3/2016 | Asthana et al. | |
| 9,396,052 B2* | 7/2016 | Sampath | G06F 11/2038 |
| 9,448,907 B2 | 9/2016 | Goutam | |
| 9,471,447 B2 | 10/2016 | Bartholomy et al. | |

(Continued)

FOREIGN PATENT DOCUMENTS

| WO | 2016187375 A1 | 11/2016 |
|---|---|---|
| WO | 2017025203 A1 | 2/2017 |

OTHER PUBLICATIONS

Technet, "Types of failover operations in Hyper-V Replica—Part I—Test Failover", published on Microsoft's Technet on Jul. 25, 2012, accessed at https://techcommunity.microsoft.com/ (Year: 2012).*

(Continued)

*Primary Examiner* — Omar F Fernandez Rivas
*Assistant Examiner* — David A Hopkins
(74) *Attorney, Agent, or Firm* — Shumaker & Sieffert, P.A.

(57) ABSTRACT

This disclosure describes techniques that include generating a simulation plan based on records that may be commonly kept when administering a computer network. This disclosure further describes techniques that include performing a simulation, based on the plan, to verity, test, and/or evaluate one or more systems, application systems, or applications that operate on the network. In one example, a method includes maintaining a storage system, generating a plan for simulating an application system, generating a simulation image, outputting the simulation image, and receiving simulation results.

20 Claims, 6 Drawing Sheets

(56) References Cited

U.S. PATENT DOCUMENTS

| | | | |
|---|---|---|---|
| 9,716,746 B2* | 7/2017 | Garg | H04L 67/10 |
| 9,772,916 B2* | 9/2017 | Rangasamy | G06F 11/00 |
| 10,146,636 B1* | 12/2018 | Ghare | G06F 11/263 |
| 2005/0002757 A1 | 1/2005 | Shimizu | |
| 2008/0172262 A1 | 7/2008 | An et al. | |
| 2008/0189154 A1 | 8/2008 | Wainwright | |
| 2008/0262895 A1 | 10/2008 | Hofmeister et al. | |
| 2008/0275756 A1 | 11/2008 | Ito et al. | |
| 2010/0077257 A1 | 3/2010 | Burchfield et al. | |
| 2011/0252003 A1 | 10/2011 | Mitchell et al. | |
| 2013/0246105 A1 | 9/2013 | Winkler et al. | |
| 2013/0346803 A1* | 12/2013 | Chiruvolu | G06F 11/3688 714/37 |
| 2014/0100913 A1 | 4/2014 | Backer et al. | |
| 2014/0298082 A1* | 10/2014 | Rikitake | G06F 11/2215 714/4.11 |
| 2015/0127432 A1 | 5/2015 | Miranda et al. | |
| 2015/0379038 A1 | 12/2015 | Nikolov | |
| 2016/0019107 A1 | 1/2016 | North | |
| 2016/0283281 A1 | 9/2016 | Antony | |
| 2016/0306719 A1 | 10/2016 | Laicher et al. | |
| 2016/0335579 A1 | 11/2016 | Anderson | |
| 2017/0046146 A1 | 2/2017 | Jamjoom et al. | |
| 2017/0123939 A1* | 5/2017 | Maheshwari | G06F 11/2071 |
| 2017/0171197 A1* | 6/2017 | Alexander | H04L 63/0876 |
| 2017/0371567 A1* | 12/2017 | Piduri | G06F 3/0619 |
| 2018/0157561 A1* | 6/2018 | Venkatesh | G06F 8/65 |
| 2018/0285210 A1* | 10/2018 | Mitkar | G06F 11/3006 |
| 2019/0188094 A1* | 6/2019 | Ramamoorthi | G06F 11/2023 |

OTHER PUBLICATIONS

Microsoft, "Automated Disaster Recovery Solution Using Azure Site Recovery For File Shares Hosted On Storsimple", 2015, accessed at https://download.microsoft.com/, alternative link is on the Microsoft Azure Blog Post "StorSimple + Azure Site Recovery , better together" published on Mar. 2, 2016 (Year: 2015).*

Orellana, "How to merge Hyper-V Checkpoints", published on Hyper-V Dojo on Feb. 16, 2016, accessed at https://www.altaro.com/hyper-v/how-to-merge-hyper-v-checkpoints/ (Year: 2016).*

Microsoft, "Azure Site Recovery: Automated VM Provisioning and Failover", Ebecs, White Paper Sponsored by Microsoft, Written by Peter Rutten and Al Gillen, for 2015 IDC, accessed at https://www.ebecs.com/wp-content/uploads/IDC-ASR-Whitepaper.pdf (Year: 2015).*

Microsoft, "Automated Disaster Recovery Testing and Failover with Hyper-V Replica and PowerShell 3.0 for FREE!", Oct. 5, 2012 is a blog post by Keith Mayer, accessed at https://docs.microsoft.com/en-US/archive (Year: 2012).*

Microsoft, "Operations Manager 2012 R2 Perfect Failover Service", Published Sep. 18, 2015, Achieved blog post Microsoft Previous Versions Documentation Repository by The Manageability Guys, accessed at https://docs.microsoft.com/en-US/archive (Year: 2015).*

Reddit, subreddit "r/Homelab", the post "Need help configuring highly available storage for Hyper-V" from a deleted user on May 20, 2016 (Year: 2016).*

Microsoft, Technet, "Checkpoints and Snapshots Overview", Published Oct. 25, 2016, Accessed on Docs.microsoft.com, Under Docs / Previous Versions/ Windows Windows Server2012 R2 and Windows Server 2012/ Server Roles and Technologies/ Hyper-V / Features / Checkpoints and snapshots (Year: 2016).*

Reddit, subreddit "r/vmware", post "Comparing replication/recovery options—SRM, Zerto, RecoverPoint? Something else?", Nov. 17, 2015 (Year: 2015).*

Reddit, subreddit "r/sysadmin", post "Practice to become a Windows sysadmin" by user silverfox17 on Jan. 2, 2016 (Year: 2016).*

Technet, "Set up Hyper-V Replica" Oct. 10, 2016, under Orphan-Topics (Year: 2016).*

Rand Morimoto, "Leveraging Microsoft Azure as your disaster recovery/failover data center", Network World, Opinion Article, Jun. 23, 2014 (Year: 2014).*

Thomas Maurer, "Hyper-V Recovery Manager (HRM) FAQ", accessed at Thomas Maurer Cloud & Datacenter, Published on Jan. 13, 2014 (Year: 2014).*

ComputerLangauge Encyclopedia, accessed Oct. 1, 2020, definitions for "system image" (Year: 2020).*

ComputerLangauge Encyclopedia, accessed Oct. 1, 2020, definitions for "image" (Year: 2020).*

Docker, Article "What is a Container", accessed Oct. 1, 2020, published by Docker (Year: 2020).*

Li, Wubin, and Ali Kanso. "Comparing containers versus virtual machines for achieving high availability." 2015 IEEE International Conference on Cloud Engineering. IEEE, 2015. (Year: 2015).*

Li, Wubin, Ali Kanso, and Abdelouahed Gherbi. "Leveraging linux containers to achieve high availability for cloud services." 2015 IEEE International Conference on Cloud Engineering. IEEE, 2015. (Year: 2015).*

Omezzine, Aya, et al. "Mobile service micro-containers for cloud environments." 2012 IEEE 21st International Workshop on Enabling Technologies: Infrastructure for Collaborative Enterprises. IEEE, 2012. (Year: 2012).*

Scott McCarty, "A Practical Introduction to Container Terminology", RedHat Developer, Blog, Feb. 22, 2018, (Year: 2018).*

Pahl, Claus. "Containerization and the paas cloud." IEEE Cloud Computing 2.3 (2015): 24-31. (Year: 2015).*

Brien Posey, "A Tale of 2 Container Deployments", 2020, Redmond Magazine (Year: 2020).*

Wikipedia, Article "System Image", accessed Oct. 1, 2020 (Year: 2020).*

Wang, Long, et al. "Experiences with building disaster recovery for enterprise-class clouds." 2015 45th Annual IEEE/IFIP International Conference on Dependable Systems and Networks. IEEE, 2015. (Year: 2015).*

Gopisetty, Sandeep, et al. "Automated planners for storage provisioning and disaster recovery." IBM Journal of Research and Development 52.4.5 (2008): 353-365. (Year: 2008).*

Calheiros, Rodrigo N., et al. "CloudSim: a toolkit for modeling and simulation of cloud computing environments and evaluation of resource provisioning algorithms." Software: Practice and experience 41.1 (2011): 23-50. (Year: 2011).*

Piraghaj, Sareh Fotuhi, et al. "ContainerCloudSim: An environment for modeling and simulation of containers in cloud data centers." Software: Practice and Experience 47.4 (2017): 505-521. (Year: 2017).*

Anne, "Agile Business Continuity Planning using Business Process Modeling Notation," ProQuest LLC, Nov. 2012, 223 pp.

Hassell, "How to master diaster recovery in a DevOps world," CIO, May 25, 2016, 5 pp.

Krocker, "Diaster Recovery Plan Testing, CYcle the Plan—Plan the Cycle," accessed from https://www.sans.org/reading-room/whitepapers/recovery/disaster-recovery-plan-testing-cycle-plan-plan-cycle-563, updated Mar. 9, 2017, 9 pp.

Lumpp et al., "From high availability and disaster recovery to business continuity solutions," IBM Systems Journal, vol. 47, No. 4, Oct. 2008, 16 pp.

Newman., "Building Microservices: Testing," O'Reilly Media, accessed from https://www.oreilly.com/learning/buildingmicroservicestesting, Aug. 26, 2015, 62 pp.

* cited by examiner

405

Simulation Header

"Name: Symbol Image Manifest - APP_ ID _200178 Record {Profile Information}

Start Date: 3/24/2017

End Date: 3/24/2017

Start Time: 17:00PM CST

End Time: 21:00PM CST

CR00000085000, Y, 03/15/2017 (CR#, Apvd, Simulation Date) {Change Request Apv'd on File}

Simulation Brief {Simulation Overview Text}

Simulation Responsible On-Call {Technology/Bus On-Call}

411 { Pre-Recovery Steps {Simulation Pre-Recovery Text}

Recovery Switchover Steps {Recovery Execution Record}

P0:R0, 1, WEB10002, WEB1100, Apache_Failover, on-call, Johnson, John, 555-555-5555 {Script to Shutdown Primary, Startup Recovery Web Server}

P0:R0, 2, APP20003, APP2001, Tomcat_Failover, on-call, Jimmy, Jay, 666-666-6666 {Script to Shutdown Primary, App Server Startup Recovery Web Server}

P0:R0, 3, F51110001,F5110001, F5_Appliance_Failover, on-call, Harrington, John, 777-777-7777 {Script to Reset F5 to Point to Recovery App Servers}

412

P0:R0, 4, NAS30004,NAS0001, NAS_Applicance_Failover, on-call, Kid, Billy, 888-888-8888 {Script to Break Mirror make Recovery Storage Appliance Primary R/W}

P0:R0, 5, SAN40005, SAN40001, SAN_Failover, on-call, Sands, John, 999-999-99999 {Script to Break Mirror switch DNS and make Recovery Storage Applicance Primary R/W}

P0:R0, 6, DB100006, DB100002, ORA_Database_Failover, on-call, Data, Joe, 444-444-44444 {Script to Break Replication take a Flashback Pt. and Switchover Primary Database to Recovery etc.}

413 & 414 { Business Validation Steps {Scripts provided by support teams}

415 { Recovery Switchback Steps {Recovery Execution Switchback}

Recovery Approval Steps {Recovery Notification and Approvals}

FIG. 4

GENERATION OF A SIMULATION PLAN AND PERFORMANCE OF A SIMULATION BASED ON THE PLAN

TECHNICAL FIELD

This disclosure relates to computer networks, and more specifically, to simulation of computing systems or other aspects of a network.

BACKGROUND

Enterprise networks, especially large enterprise networks, require significant efforts to maintain and administer. Such networks typically host many different types of applications and systems, each of which may evolve through continual updates, modifications, and bug fixes. The continually changing nature of a typical enterprise network makes business continuity planning difficult. Further, other types of large networks may also experience continual change and evolution, and for those networks as well, effectively planning for adverse events is difficult.

SUMMARY

This disclosure describes techniques that include generating a simulation plan based on records that may be typically and/or commonly kept when administering a computer network. In some examples, the simulation plan outlines a procedure, process, or game plan for simulating, verifying, testing, and/or exercising one or more applications, systems, or other aspects of the computer network. This disclosure further describes techniques that include performing a simulation, based on the simulation plan, to verify, test, exercise, and/or evaluate one or more systems, application systems, or applications that operate on the network.

In some examples, the computer network may be a large enterprise network, and in such an example, a simulation may be performed to evaluate the sufficiency of a business continuity plan implemented by an administrator of the enterprise network. For instance, by generating a plan to simulate aspects of an enterprise network based on records stored within the network, and then performing a simulation based on the plan, business continuity plans and/or disaster recovery processes can be more effectively simulated. By more effectively simulating business continuity plans and/or disaster recovery processes, such plans and processes are more likely to prevent network downtime when called upon.

Techniques in accordance with one or more aspects of the present disclosure may, in some examples, enable automatic generation of a plan to simulate an application and/or other aspects of a network. Further, techniques in accordance with one or more aspects of the present disclosure may, in some examples, enable automatic generation of one or more simulation images (e.g., binary artifacts or code images) that are configured to perform a simulation of aspects of the network pursuant to the simulation plan. Still further, techniques in accordance with one or more aspects of the present disclosure may, in some examples, enable automatic simulation of aspects of the network pursuant to the plan, and as a result of execution of a virtualized computing environment based on the simulation images. By enabling automatic or near-automatic generation of a plan and simulation of a network pursuant to the plan, performing simulations may become less burdensome and time consuming, and thereby enable or encourage more frequent simulations. In some respects, techniques described herein may implement a microservice architecture, where infrastructure is modular and programmable (e.g., as an infrastructure as code (IAC) architecture). Such an architecture may enable enterprise applications and business continuity planning techniques to be automatically tested, managed, and provisioned through software code, rather than through less efficient legacy processes.

In one example, this disclosure describes a method comprising: maintaining, by a computing system, a storage system that includes information about a plurality of application systems operating within a network; generating, by the computing system and based on the information included within the storage system, a plan for simulating an application system, wherein the application system is included within the plurality of application systems, and wherein the plan includes information about computing resources used by the application system; generating, by the computing system and based on the plan, a simulation image that includes computing instructions sufficient to generate the computing resources used by the application system; outputting, by the computing system and to a simulation computing system, the simulation image; and receiving, by the computing system and from the simulation computing system, simulation results, wherein the simulation results are produced by a virtual computing environment generated from the simulation image and executed on the simulation computing system.

In another example, this disclosure describes a computing system comprising: a storage device; and processing circuitry having access to the storage device and configured to: maintain a storage system that includes information about a plurality of application systems operating within a network, generate, based on the information included within the storage system, a plan for simulating an application system, wherein the application system is included within the plurality of application systems, and wherein the plan includes information about computing resources used by the application system, generate, based on the plan, a simulation image that includes computing instructions sufficient to generate the computing resources used by the application system, output, to a simulation computing system, the simulation image, and receive, from the simulation computing system, simulation results, wherein the simulation results are produced by a virtual computing environment generated from the simulation image and executed on the simulation computing system.

In another example, this disclosure describes a computer-readable storage medium comprising instructions that, when executed, configure processing circuitry of a computing system to: maintain a storage system that includes information about a plurality of application systems operating within a network; generate, based on the information included within the storage system, a plan for simulating an application system, wherein the application system is included within the plurality of application systems, and wherein the plan includes information about computing resources used by the application system; generate, based on the plan, a simulation image that includes computing instructions sufficient to generate the computing resources used by the application system; output, to a simulation computing system, the simulation image; and receive, from the simulation computing system, simulation results, wherein the simulation results are produced by a virtual computing environment generated from the simulation image and executed on the simulation computing system.

The details of one or more examples of the disclosure are set forth in the accompanying drawings and the description below. Other features, objects, and advantages of the disclosure will be apparent from the description and drawings, and from the claims.

BRIEF DESCRIPTION OF THE DRAWINGS

FIG. 4 illustrates an example simulation plan for simulating one or more applications or application systems in accordance with one or more aspects of the present disclosure.

DETAILED DESCRIPTION

Figure 1:
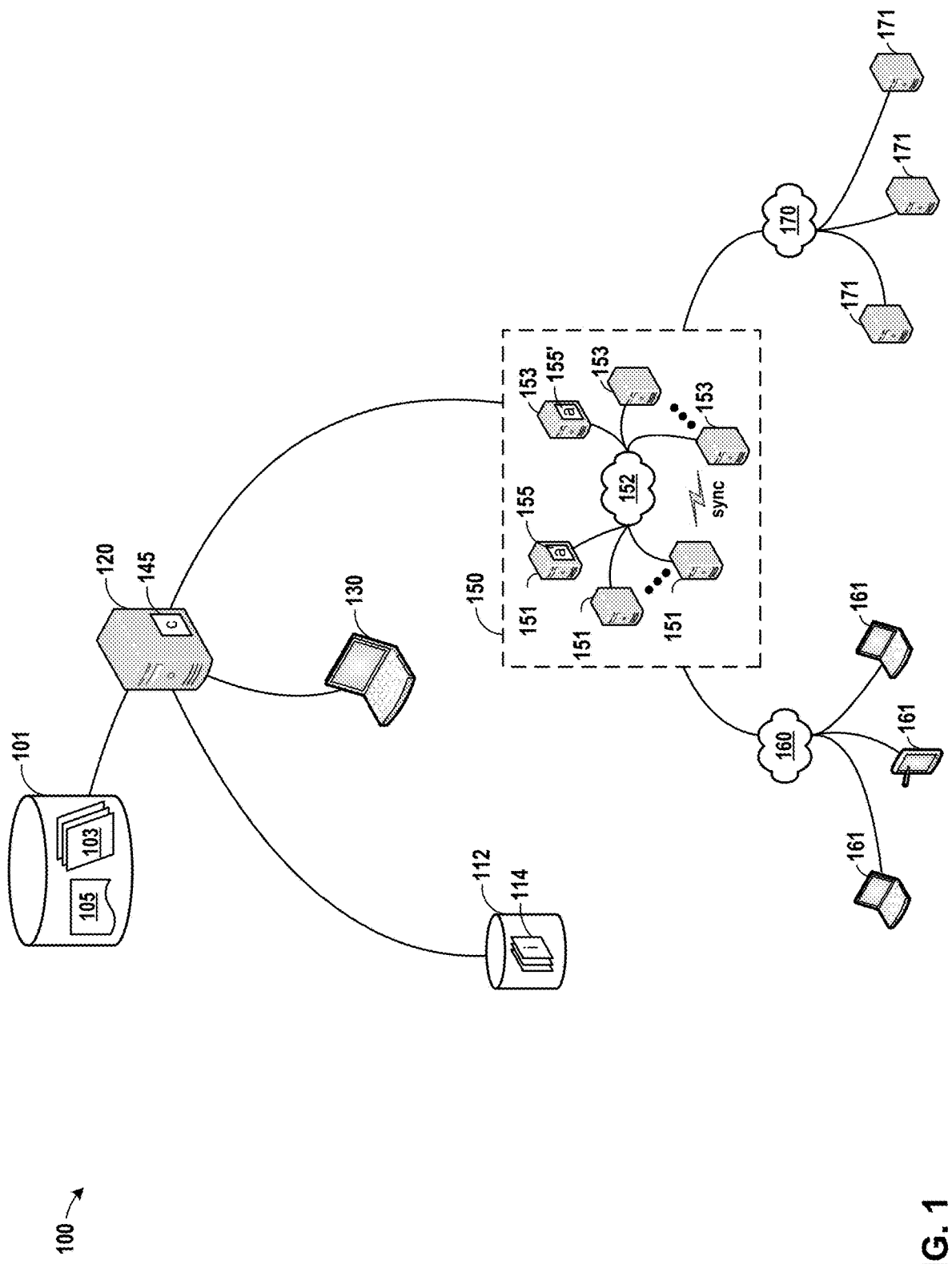
FIG. 1 is a conceptual diagram illustrating an example system for generating a plan to simulate and/or test aspects of a network based on records stored within the network, and perform a simulation and/or test based on the plan, in accordance with one or more aspects of the present disclosure.

FIG. 1 is a conceptual diagram illustrating an example system for generating a plan to simulate and/or test aspects of a network based on records stored within the network, and perform a simulation and/or test based on the plan, in accordance with one or more aspects of the present disclosure. The example of FIG. 1 includes an enterprise network generally characterized by data center 150 that is controlled, administered, or otherwise managed by resource asset manager 120. Data center 150 communicates with client devices 161 through network 160, and with external services 171 through network 170. Resource asset manager 120 may receive interactions from console 130, and may perform functions in response to input received from console 130. Resource asset manager 120 also communicates with, and/or has access to, enterprise data store 101 and image repository 112.

In the example of FIG. 1, an enterprise network in FIG. 1 might include all of the components shown in FIG. 1, with the exception of network 170, external services 171. Network 170 may act as an external gateway to external services 171. Further, in some examples, some or all of image repository 112 may be maintained by entities not associated with the entity administering the enterprise network, so in such examples, the enterprise network might not include image repository 112.

Data center 150 in FIG. 1 includes production computing devices 151 and secondary computing devices 153 interconnected by data center network 152. Data center 150 may host enterprise applications (e.g., enterprise application 155) and provide a platform for execution of applications and services provided to users of computing resources included with in data center 150. Users may interact with data center 150 through network 160 using client devices 161. One or more computing devices within data center 150 may interact with external services 171 through network 170 to perform tasks, services, and/or other functions on behalf of client devices 161. One or more client devices 161 may be operated by users of the enterprise network, and may access functionality of the enterprise network, generally provided by data center 150.

Enterprise data store 101 may represent any suitable data structure or storage medium for storing information related to system 100 or systems, devices, or applications included within system 100. In some examples, enterprise data store 101 may represent a system of record associated with an enterprise network, which may serve as an authoritative data source for at least some data pertaining to the enterprise network, or pertaining to the operations of the business, organization, or other entity that administers the enterprise network. Enterprise data store 101 may be updated and/or maintained by resource asset manager 120. The information stored in enterprise data store 101 may be searchable and/or categorized such that one or more modules of resource asset manager 120 may provide an input requesting information from enterprise data store 101, and in response to the input, receive information stored within enterprise data store 101. In the example of FIG. 1, enterprise data store 101 includes one or more application information records 103 and one or more simulation plans 105. In some examples, aspects of enterprise data store 101 may be included within resource asset manager 120. In other examples, some or all of enterprise data store 101 may be may be accessed through a separate system.

Image repository 112 may represent any suitable data repository or storage device for storing images 114, which may include binary images and/or source code that can serve as the basis for virtualized computing environments (e.g., containers and/or virtual machines). As an example, one or more images 114 included within image repository 112 may be used to generate a container or virtual machine executing a particular version of the Linux operating system. In another example, one or more images 114 may be used to generate a container providing the functionality of the Apache web server. In some examples, image repository 112 may represent a binary repository service that provides access to images, binary images, and/or binary artifacts used or produced in software development and simulation environments. Accordingly, image repository 112 may act as a software repository for packages, artifacts, and corresponding meta data. Image repository 112 may be administered by resource asset manager 120 or by a third party, and may include images created by resource asset manager 120 and/or by third parties. In some examples, images included within image repository 112 may include images from other open source repositories or those commercially available from third parties. Image repository 112 may provide version control features, and may centralize some aspects of the management of the binary images generated and/or used by resource asset manager 120 and/or an enterprise network associated with resource asset manager 120. In some examples, image repository 112 may be included within resource asset manager 120, or in other examples, some or all of image repository 112 may be accessed through a separate system.

In operation, resource asset manager 120 receives information about an application, e.g., enterprise application 155, that is deployed, stored, and/or executing within one or more data centers 150. For instance, for an enterprise that has multiple lines of business, each line of business may develop applications for execution on the shared enterprise network (e.g., within data center 150) used by each line of business within the enterprise. Typically, each such line of business is responsible for maintaining certain information for any applications that are used by that line of business from sunrise of the application (initial development of the application) to sunset of the application (phasing out or shutting down of redundant or obsolete business applications). For instance, each line of business may maintain, for each application, a list of resources needed by the application for proper performance (e.g., CPU, memory, and other resource requirements). Each line of business may also maintain a list of dependencies (e.g., data required, internal hardware, software, and/or databases required for operation, external services 171) that the enterprise application relies upon to operate effectively and perform services on behalf of client devices 161. Each line of business may further maintain a list of guidelines for how the application is to be simulated and/or tested on a periodic basis. Finally, each line of business may also maintain further information about the enterprise application, including how it is deployed, usage patterns, and/or historical information. Maintenance of such information may involve creating and updating one or more application information records 103 included within enterprise data store 101 for the enterprise network illustrated in FIG. 1.

Resource asset manager 120 may receive information about applications from the line of business or other source through console 130, or through another channel or system. As changes, modifications, or updates to enterprise applications are made, resource asset manager 120 may receive further information about enterprise application 155. As the enterprise application evolves during its lifecycle, resource asset manager 120 may use such further information to update enterprise data store 101, and may include some or all of such information within application information records 103. Accordingly, in some examples, a business or other entity may maintain enterprise data store 101 and keep within enterprise data store 101 up-to-date information about some or all of the many enterprise applications that may execute within data center 150. Enterprise data store 101 therefore may provide a relatively comprehensive roadmap of what resources each application requires, and any dependencies relied upon by the application.

At any given point in time, therefore, application information record 103 for enterprise application 155 may include relatively up-to-date information about what types of computing, storage, and/or network resources are needed by enterprise application 155. Application information record 103 for enterprise application 155 may also include other information, such as any other systems used by enterprise application 155, and/or any dependencies of enterprise application 155. For instance, enterprise application 155 may rely on one or more external services 171, and application information record 103 for enterprise application 155 may reflect such dependencies.

When enterprise application 155 is deployed and in use, within data center 150, enterprise application 155 normally executes on production computing devices 151, and is accessible to one or more of client devices 161 that may request that enterprise application 155 perform services on their behalf. For instance, in one example, one or more of client devices 161 may interact with one or more production computing devices 151 executing enterprise application 155 within data center 150. Enterprise application 155, or a module corresponding to enterprise application 155, may receive one or more indications of input that it determines correspond to input from a user of a client device 161. In response to the input, enterprise application 155 causes one or more production computing devices 151 to perform operations and services on behalf of the user of a client device 161. In some cases, enterprise application 155 may need to access external resources, such as those provided by external services 171, to perform functions on behalf of a client device 161. For instance, enterprise application 155 may access one or more of external services 171 to access data available external to data centers 150 or may access one or more external services 171 to cause one or more of external services 171 to perform a computing function on behalf of enterprise application 155. Accordingly, and in general, production computing devices 151 within data centers 150 perform, with occasional help from external services 171, services on behalf of enterprise network users that are operating client devices 161.

Secondary computing devices 153, included within data center 150, might not be used during normal operation. Instead, secondary computing devices 153 are used for backup or business continuity purposes. In some examples, production computing devices 151 within data center 150 are occasionally or continually replicated to secondary computing devices 153, so that secondary computing devices 153 may act as a synchronized version of production computing devices 151 in at least some respects.

Occasionally, one or more production computing devices 151 of data center 150 may become unavailable due to an event, such as a hardware failure, an error caused by a software bug, a natural disaster, actions by malicious users or actors, or other events. In some examples, therefore, one or more of production computing devices 151 of data center 150 may become unavailable due to such an event. In response, resource asset manager 120 interacts with data center 150 to initiate a failover operation that configures data center 150 so that the functions of production computing devices 151 are assumed by secondary computing devices 153. During failover, secondary computing devices 153 performs the operations, services, and other tasks normally performed by production computing devices 151. Accordingly, during failover, one or more of the business applications (e.g., enterprise application 155) executing on production computing devices 151 prior to the event execute on secondary computing devices 153 after the event (e.g., as represented by enterprise application 155'). Since secondary computing devices 153 represent a synchronized version of production computing devices 151, secondary computing devices 153 might continue operations of the production computing devices 151 with little or no interruption to services being provided by data center 150 on behalf of client devices 161. Once production computing devices 151 become available again and are synchronized with secondary computing devices 153, resource asset manager 120 performs a failback operation restoring production traffic to production computing devices 151 from secondary computing devices 153. Resource asset manager 120 may also transfer the state of secondary computing devices 153 to production computing devices 151 so that enterprise applications executing on secondary computing devices 153 during failover (e.g., enterprise application 155') are restored so that they can resume executing on production computing devices 151 (e.g., as enterprise application 155).

In order for the failover and failback operations described above to avoid any disruption to users of the enterprise network (e.g., users of client devices 161), a number of operations should be performed properly when a failover event occurs. For instance, the failover operation should be performed properly so that secondary computing devices 153 may take over the task of providing computing resources otherwise provided by production computing devices 151 during normal operations. During failover (e.g., after the failover operation has been performed and secondary computing devices 153 have assumed production traffic from production computing devices 151), secondary computing devices 153 should operate to faithfully provide services as would production computing devices 151 during normal operations. And once production computing devices 151 are operational again, the failback operation should be performed so that the state of production computing devices 151 is properly restored, taking into account any operations performed by secondary computing devices 153 during the time that production computing devices 151 was unavailable.

To ensure that such operations are performed correctly, an enterprise may routinely, periodically, or occasionally engage in exercises that simulate failures affecting production computing devices 151. Such exercises can be used to provide assurance that business continuity practices employed by a business or other organization are adequate. Such exercises can also be used to identify problems with such practices. In some cases, and for some types of businesses, exercises simulating or testing business continuity plans may be mandated by government regulation.

In FIG. 1, and in accordance with one or more aspects of the present disclosure, resource asset manager 120 may generate simulation plan 105 for performing a simulation of enterprise application 155. For instance, in the example of FIG. 1, resource asset manager 120 executes one or more scheduling objects that occasionally or periodically schedules simulations of enterprise application 155. In response to detecting that a simulation of enterprise application 155 is scheduled to be performed, resource asset manager 120 analyzes information included within enterprise data store 101, such as application information records 103. Based on the analysis, resource asset manager 120 generates simulation plan 105, which includes details about how to perform a simulation involving enterprise application 155. In some examples, simulation plan 105 describes how to (1) perform a failover operation causing the execution of enterprise application 155 to failover from production computing devices 151 to secondary computing devices 153, (2) perform the simulation of enterprise application 155 on secondary computing devices 153, and (3) perform a failback operation restoring execution of enterprise application 155 from secondary computing devices 153 to production computing devices 151.

Resource asset manager 120 may generate and/or collect multiple images 114 and assemble them into a combined image. For instance, in the example of FIG. 1, resource asset manager 120 analyzes simulation plan 105 and determines and/or identifies one or more images 114 that have the functionality required to execute simulation plan 105 and perform a simulation of enterprise application 155. Images 114 are the basis for virtualized computing environments for applications, operating systems, libraries, and/or code that implement functionality needed to test, exercise, or perform a simulation of enterprise application 155. Resource asset manager 120 either retrieves or generates each of the images 114 required to both execute simulation plan 105 and perform a simulation of enterprise application 155. For example, resource asset manager 120 may retrieve from image repository 112 any of the required images 114 that may be stored within image repository 112. Alternatively, or in addition, resource asset manager 120 may generate any images 114 not retrieved from or available through image repository 112. Resource asset manager 120 then generates, from the required images 114, a combined image.

Resource asset manager 120 may use the combined image to spin up one or more containers 145. For instance, in the example of FIG. 1, resource asset manager 120 interacts with data center 150 to determine whether data center 150 has enough computing resources to perform a simulation of enterprise application 155 pursuant to simulation plan 105. In some cases, data center 150 might not have the required resources (e.g., insufficient computing resources, CPU, memory requirements, and/or network connectivity) to simulate enterprise application 155 pursuant to simulation plan 105. In such an example, the simulation of enterprise application 155 may be delayed or rescheduled. If, however, resource asset manager 120 determines that data center 150 does have sufficient resources, resource asset manager 120 uses the combined image generated from images 114 to spin up and execute one or more containers 145 having the functionality to execute simulation plan 105 and simulate enterprise application 155.

Container 145 may perform a simulation of enterprise application 155 pursuant to simulation plan 105. For instance, in the example of FIG. 1, container 145 interacts with data center 150 to perform a failover operation causing the execution of enterprise application 155 to failover from production computing devices 151 to secondary computing devices 153. Such a failover operation may involve container 145 suspending production traffic involving enterprise application 155, so that services normally performed by enterprise application 155 on behalf of client devices 161 are not available to client devices 161. During failover, enterprise application 155 executes on secondary computing device 153 as enterprise application 155'. Container 145 performs a simulation of enterprise application 155' on secondary computing devices 153, which may involve performing a set of business validations relating to operations and services performed by enterprise application 155 during the normal course of business. In some examples, container 145 generates simulated traffic and evaluates the response of enterprise application 155'. Also, container 145 may simulate resources that enterprise application 155' interacts with, such as one or more databases, web sites, or other resources. For instance, one or more of such resources might normally be provided by external services 171, but during the simulation, such resources may be implemented or simulated by container 145 executing on resource asset manager 120.

Container 145 may conclude the simulation and evaluate and/or store the results. For instance, in the example of FIG. 1, once the simulation is complete, container 145 performs a failback operation restoring execution of enterprise application 155 from secondary computing devices 153 to production computing devices 151. To perform the failback operation, container 145 brings production computing devices 151 back online and resynchronizes secondary computing devices 153 with production computing devices 151 so that secondary computing devices 153 may again serve as a backup system for production computing devices 151. Resource asset manager 120 collects information about the results of the simulation, which may include information about outcomes, state, and output generated during the simulation. During or after the test, resource asset manager 120 may compare the information to expected outcomes, state, and output received, and evaluate the results of the test. Resource asset manager 120 may update enterprise data store 101 to reflect the completion and/or results of the simulation.

In some examples, container 145 might only test a subset of the enterprise applications operating on data center 150 or within the enterprise network. In other words, system 100 and/or container 145 may enable simulation and/or testing of only some enterprise applications operating on the enterprise network, without requiring all or large subsets of enterprise applications to be simulated and taken offline. Similarly, container 145 may test only a portion of a single enterprise application. In such an example, container 145 may simulate one or more enterprise applications for very specific use cases, such as when enterprise application 155 uses or relies on a specific library or environment. For instance, if enterprise application 155 was developed using a specific dependency (e.g., Java version 1.X), enterprise application 155 might be simulated using that specific dependency. Further, enterprise application 155 might alternatively be simulated using a later version of that dependency (e.g., Java version 2.X). Container 145 may be configured in each case to be instantiated or spun up from a combined image that includes images 114 for only the desired dependency or dependencies applicable to the simulation (e.g., the specific version of Java sought to be simulated or tested).

In this disclosure, operations performed by a virtualized computing device (e.g., container 145) may be primarily described in the context of a simulation of an enterprise application, such as enterprise application 155 described in connection with FIG. 1. However, it should be understood that the term 'simulation' may encompass a test, an analysis, and/or another type of evaluation of enterprise application 155 or other application or system.

By generating a plan to simulate aspects of an enterprise network based on records stored within the network, and then performing a simulation based on the plan, system 100 may more effectively simulate business continuity plans and/or disaster recovery processes. By more effectively simulating business continuity plans and/or disaster recovery processes, system 100 may avoid downtime, because if business continuity plans and/or disaster recovery processes are simulated effectively, they are more likely to serve the purpose of preventing network downtime when called upon. Accordingly, as a result of more effectively simulating business continuity plans and/or disaster recovery processes, system 100 may operate more reliably with less downtime. Therefore, aspects of this disclosure may improve the function of system 100 because more effectively and/or more frequently performing simulations may have the effect of enabling system 100 to operate more reliably. In some respects, techniques described herein may implement a programmable infrastructure or an infrastructure as code (IAC) architecture that enables enterprise applications to be automatically be tested, managed, and provisioned through software code, rather than through a process that requires significant manual efforts.

Figure 2:
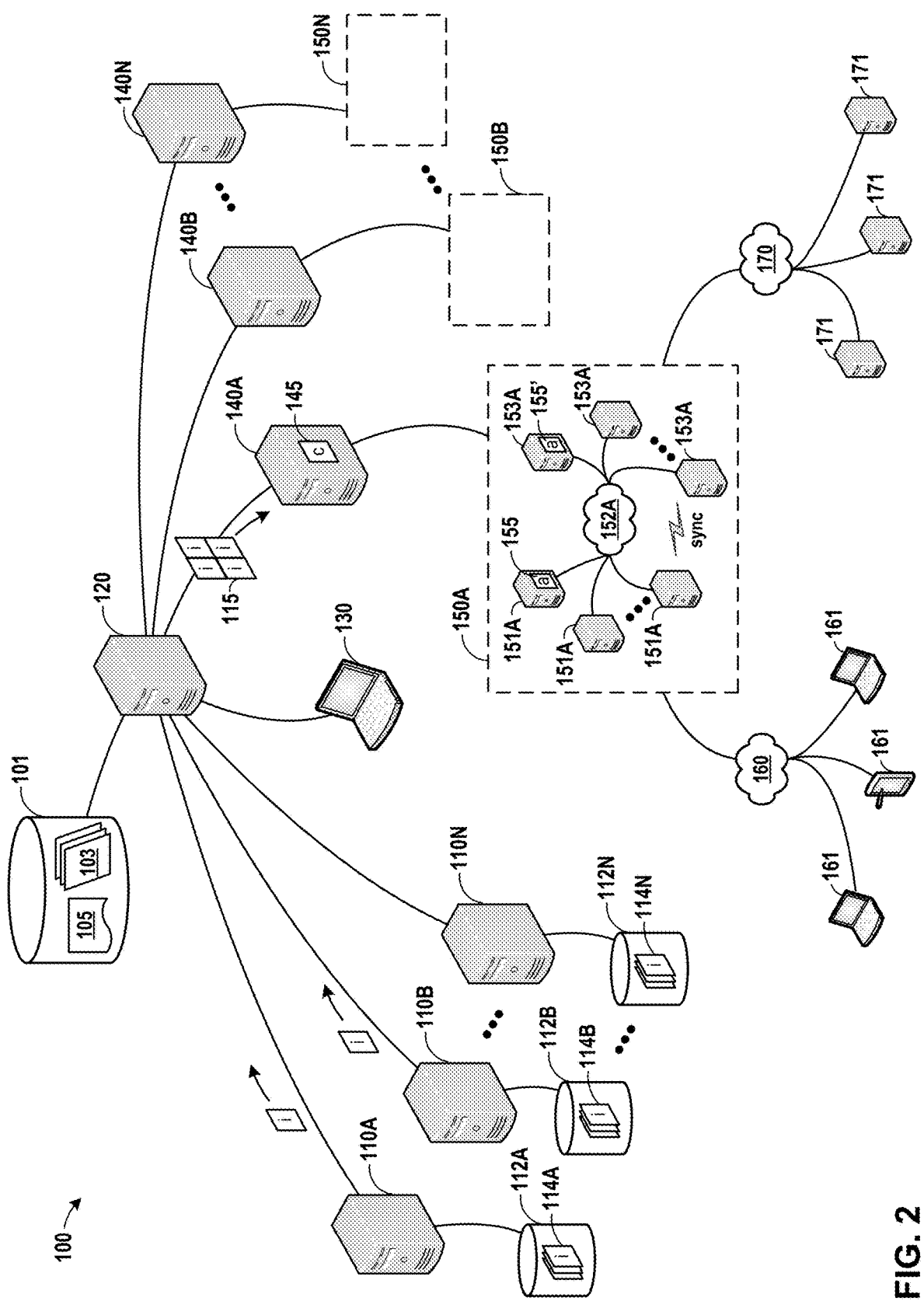
FIG. 2 is a conceptual diagram illustrating an example system for generating a plan to simulate and/or test aspects of a large enterprise network based on records stored within the network, and perform a simulation and/or test of the enterprise network based on the plan, in accordance with one or more aspects of the present disclosure.

FIG. 2 is a conceptual diagram illustrating an example system for generating a plan to simulate and/or test aspects of a large enterprise network based on records stored within the network, and perform a simulation and/or test of the enterprise network based on the plan, in accordance with one or more aspects of the present disclosure. FIG. 2 is similar to FIG. 1, and some aspects of system 100 in FIG. 2 correspond to those illustrated in FIG. 1. Components and/or systems illustrated in FIG. 2 may correspond to or be implemented in a manner similar to components and/or systems in FIG. 1 having the same reference numeral. However, the enterprise network depicted in the example of FIG. 2 differs from that in FIG. 1 at least in that the enterprise network of FIG. 2 may represent a larger-scale enterprise network. For instance, an enterprise network used or administered by a large organization, such as a financial institution, bank, medical facility, or other type of large organization, will commonly rely on significant computing resources. For some large organizations, the required computing resources are provided through multiple data centers deployed within the enterprise network.

Accordingly, the enterprise network in FIG. 2 is characterized by multiple data centers 150 (e.g., data center 150A through data center 150N) administered, controlled, or otherwise managed by cluster managers 140 (e.g., cluster manager 140A through cluster manager 140N, respectively). (As used herein, "N" is any number such that data centers 150, for example, represents any number of data centers, and cluster managers 140, for example, represents any number of cluster managers.) Each of data centers 150 may include one or more production computing devices 151 and secondary computing devices 153. For instance, as shown in FIG. 2, data center 150A includes production computing devices 151A and secondary computing devices 153A interconnected by data center network 152A. For ease of illustration, only data center 150A, data center 150B, and data center 150N are illustrated in FIG. 2. Further, and also for ease of illustration, only production computing devices 151A, secondary computing devices 153A, and data center network 152A are illustrated in FIG. 2; production computing devices 151B, secondary computing devices 153B, data center network 152B should be understood to be included within data center 150B; production computing devices 151N, secondary computing devices 153N, data center network 152N should be understood to be included within data center 150N. Data centers 150 and/or production computing devices 151 and secondary computing devices 153 within each of data centers 150 may host enterprise applications and provide a platform for execution of applications and services provided to users computing resources included within data centers 150.

In the example of FIG. 2, users interact with one or more of data centers 150 using client devices 161 interconnected to each of data centers 150 through network 160 (i.e., although not specifically shown in FIG. 2, data center 150A, data center 150B, through data center 150N may be accessible to client devices 161 through network 160). One or more computing devices within data centers 150 may interact with external services 171 to perform tasks, services, and/or other functions on behalf of client devices 161 (i.e., each of data centers 150 may be capable of accessing any of external services 171 through network 170).

In FIG. 2, one or more resource asset managers 120 has access to and/or is in communication with enterprise data store 101, which may include one or more application information records 103 and one or more simulation plans 105. Resource asset manager 120 interacts with each of cluster managers 140, typically through a network (not shown). Similarly, resource asset manager 120 interacts with image factories 110 (e.g., image factory 110A through image factory 110N), also typically through a network (not shown). As in FIG. 2, resource asset manager 120 of FIG. 2 may respond to input received from console 130. Each of image factories 110 may include or have access to image repositories 112, which may include one or more images 114. For large enterprise networks, typically resource asset manager 120 will interact with multiple image factories 110, some of which may be part of the enterprise network. However, in some cases, one or more of image factories 110 and image repositories 112 might be maintained by entities not part of or associated with the enterprise or business that operates the enterprise network included within FIG. 2. Accordingly, in the example of FIG. 2, the enterprise network illustrated in FIG. 2 might include all of the components shown in FIG. 2, with the exception of network 170, external services 171, and possibly one or more image factories 110.

Each of the computing systems illustrated in FIG. 2 (e.g., resource asset managers 120, image factories 110, console 130, cluster managers 140, production computing devices 151, secondary computing devices 153, client devices 161, external services 171) may represent any suitable computing system, such as one or more server computers, cloud computing systems, mainframes, appliances, desktop computers, laptop computers, mobile devices, and/or any other computing device that may be capable of performing operations in accordance with one or more aspects of the present disclosure. One or more of such devices may perform operations described herein as a result of instructions, stored on a computer-readable storage medium, executing on one or more processors. The instructions may be in the form of software stored on one or more local or remote computer readable storage devices. In other examples, one or more of such computing devices may perform operations using hardware, firmware, or a mixture of hardware, software, and firmware residing in and/or executing at each of such computing devices.

In FIG. 2, and in accordance with one or more aspects of the present disclosure, resource asset manager 120 may generate combined image 115. For instance, in the example of FIG. 2, resource asset manager 120 generates simulation plan 105 as described in connection with FIG. 1. Resource asset manager 120 then analyzes simulation plan 105 and determines and/or identifies one or more images 114 that have the functionality required to execute simulation plan 105 and perform a simulation of enterprise application 155. Resource asset manager 120 sends information about simulation plan 105 to image factories 110, specifying or describing the images 114 required to execute simulation plan 105 and perform a simulation of enterprise application 155 pursuant to simulation plan 105. Image factories 110 respond to resource asset manager 120 by sending any images 114 that have already been generated or that are available within image repositories 112 associated with image factories 110. For example, one or more of image repositories 112 may already include a binary image that can be used to instantiate an instance of functionality (e.g., a Linux operating system) required to execute simulation plan 105. For those images 114 that are not available within image repositories 112, but that are required to execute simulation plan 105, one or more of image factories 110 generates the required images 114, based on the information about simulation plan 105 received from resource asset manager 120. One or more image factories 110 send the remaining images 114 to resource asset managers 120. Resource asset manager 120 collects images 114 required to execute simulation plan 105, and assembles such images 114 into combined image 115.

Resource asset manager 120 may cause cluster manager 140A to use combined image 115 to spin up one or more containers 145. For instance, in the example of FIG. 2, resource asset manager 120 interacts with cluster managers 140 to identify, based on simulation plan 105, which of data centers 150 have the resources for performing the simulation of enterprise application 155 pursuant to simulation plan 105. In some cases, one or more of data centers 150 may be under load, and might not have the resources required (e.g., computing resources, CPU, memory requirements, network connectivity) to perform the simulation of enterprise application 155 pursuant to simulation plan 105. In the example of FIG. 1, resource asset manager 120 determines, based on interactions with cluster manager 140A, that data center 150A has the capacity to perform the test of enterprise application 155. Resource asset manager 120 pushes or communicates combined image 115 to cluster manager 140A. Cluster manager 140A uses combined image 115 to spin up one or more containers 145.

Container 145 may perform a simulation of enterprise application 155 pursuant to simulation plan 105. For instance, in the example of FIG. 2, container 145 causes cluster manager 140A to interact with data center 150A to perform a failover operation causing the execution of enterprise application 155 to failover from production computing devices 151A to secondary computing devices 153A. Thereafter, container 145 performs a simulation of enterprise application 155' on secondary computing devices 153A, executing a set of business validations, generating simulated traffic, and/or simulating any resources required by enterprise application 155 during the test. After the simulation is complete, container 145 performs a failback operation restoring execution of enterprise application 155 from secondary computing devices 153A to production computing devices 151A. Container 145 collects information about the results of the simulation and communicates the information to resource asset manager 120. Resource asset manager 120 updates enterprise data store 101 to reflect the completion and/or results of the simulation.

In some examples, multiple enterprise applications may be simulated within multiple cluster managers and data centers simultaneously, so that multiple containers 145 may be executing within each data center and/or across a plurality of data centers 150. In such examples, containers 145 may intelligently interact with each other and/or communicate with each other as hive that solves simulation problems, schedules further simulations, moves simulations between data centers based on resource allocations, communicates with resource asset manager 120 to update scheduled simulations, reconfigures scheduled simulations, and/or schedules new simulations. In some examples, each of containers 145 may exhibit artificial intelligence and/or machine learning characteristics to perform such functions.

Figure 3:
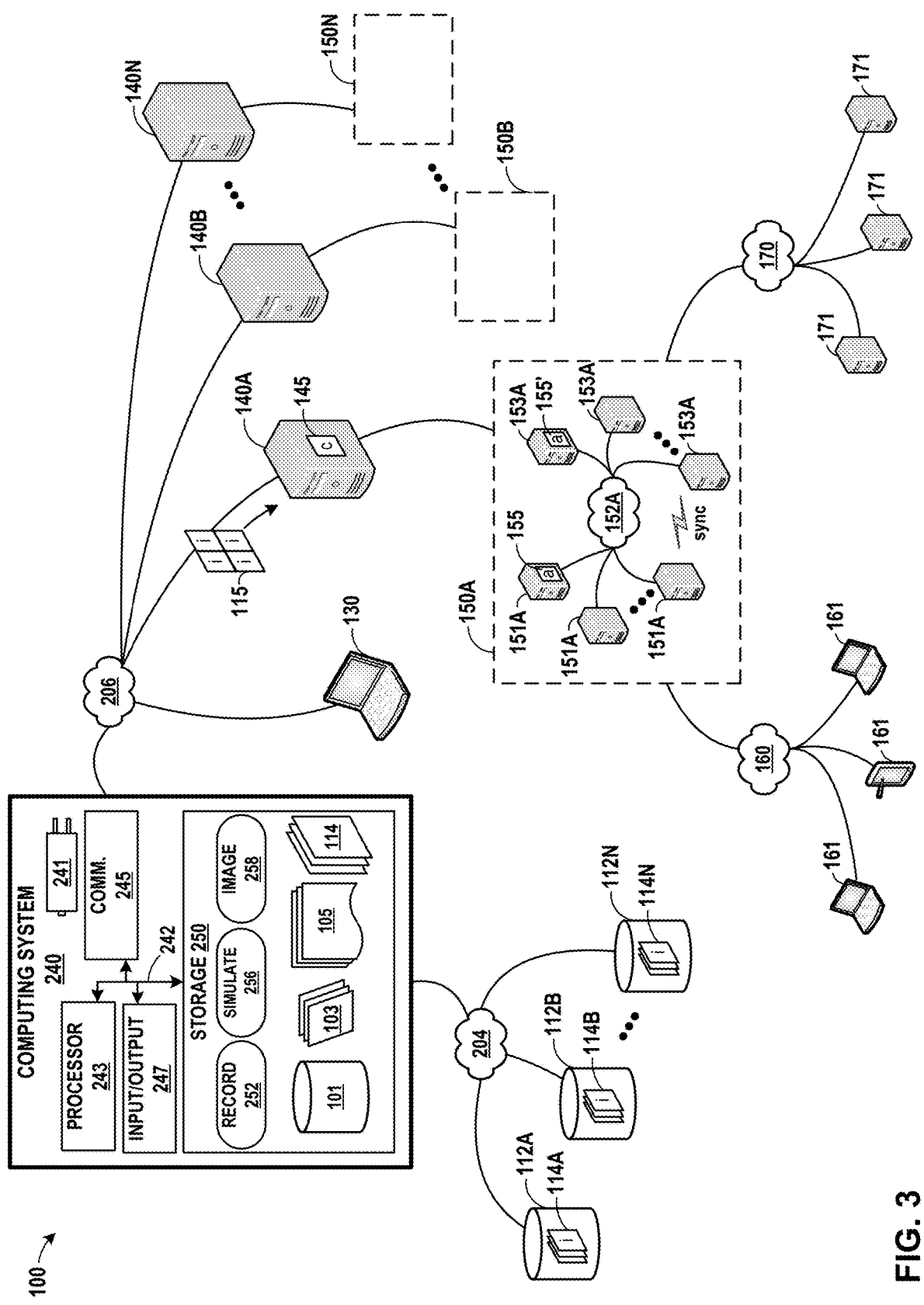
FIG. 3 illustrates a conceptual diagram that includes a block diagram of an example computing system that generates a plan to simulate and/or test aspects of a large enterprise network based on records stored within the network, in accordance with one or more aspects of the present disclosure.

FIG. 3 illustrates a conceptual diagram that includes a block diagram of an example computing system that generates a plan to simulate and/or test aspects of a large enterprise network based on records stored within the network, in accordance with one or more aspects of the present disclosure. System 100 of FIG. 3 may be described as an example or alternate implementation of system 100 of FIG. 1 or FIG. 2. FIG. 3 illustrates one example implementation of system 100 and computing system 240. Other example implementations of system 100 and computing system 240 may be appropriate in other instances. Such implementations may include a subset of the devices and/or components included in the example of FIG. 3 and/or may include additional devices and/or components not shown in FIG. 3.

System 100 and devices illustrated as part of system 100 in FIG. 3 may be implemented in a number of different ways. In some examples, one or more devices illustrated in FIG. 3 as separate devices may be implemented as a single device; one or more components illustrated in FIG. 3 that are illustrated as separate components may be implemented as a single component. Also, in some examples, one or more devices illustrated in FIG. 3 as a single device may be implemented as multiple devices; one or more components illustrated in FIG. 3 as a single component may be implemented as multiple components. Further, one or more devices or components illustrated in FIG. 3 may be implemented as part of another device or component not shown in FIG. 3. Some of the functions described herein may be performed via distributed processing by two or more devices.

In the example of FIG. 3, system 100 includes computing system 240 in communication, via network 206, with console 130. Computing system 240 is also in communication, via network 206, with one or more data centers 150 through cluster managers 140. Console 130, cluster managers 140, and data centers 150 may correspond to console 130, cluster managers 140, data centers 150 illustrated in FIG. 2 and described in connection with the description of FIG. 2. Similarly, FIG. 3 includes network 160, client devices 161, network 170, and external services 171, each of which may correspond to like-numbered components or systems illustrated in FIG. 2 and described in connection with the description of FIG. 2.

In the example of FIG. 3, computing system 240 is also in communication, via network 204, with image repositories 112, each of which may include one or more images 114. Each of image repositories 112 may represent an external image repository accessible to computing system 240 through network 204. Each of image repositories 112 may operate in a manner similar to image repositories 112 illustrated in FIG. 2.

Each of the networks illustrated in FIG. 3 (e.g., network 160, network 170, network 204, network 206) may include or represent any public or private communications network or other network. One or more client devices, server devices, or other devices may transmit and receive data, commands, control signals, and/or other information across such networks using any suitable communication techniques. In some examples, each of network 160, network 170, network 204, and network 206 may be a separate network, as illustrated in FIG. 3, or one or more of such networks may be a subnetwork of another network. In other examples, two or more of such networks may be combined into a single network; further, one or more of such networks may be, or may be part of, the internet. Accordingly, one or more of the devices or systems illustrated in FIG. 3 may be in a remote location relative to one or more other illustrated devices or systems. Networks illustrated in FIG. 3 may include one or more network hubs, network switches, network routers, network links, satellite dishes, or any other network equipment. Such devices or components may be operatively inter-coupled, thereby providing for the exchange of information between computers, devices, or other components (e.g., between one or more client devices or systems and one or more server devices or systems).

In FIG. 3, computing system 240 may generally correspond to a system that combines, includes, and/or implements aspects of the functionality of resource asset manager 120, enterprise data store 101, and image factories 110 illustrated in FIG. 2. Accordingly, computing system 240 may perform some or all of the same functions described in connection with FIG. 2 as being performed by resource asset manager 120, enterprise data store 101, and/or image factories 110.

Computing system 240 may be implemented as any suitable computing system, such as one or more server computers, workstations, mainframes, appliances, cloud computing systems, and/or other computing systems that may be capable of performing operations and/or functions described in accordance with one or more aspects of the present disclosure. In some examples, computing system 240 represents a cloud computing system, server farm, and/or server cluster (or portion thereof) that provides services to client devices and other devices or systems. For example, computing system 240 may host or provide access to services provided by one or more modules (e.g., recordkeeping module 252, simulation module 256, image factory module 258) of computing system 240. Computing system 240 may provide, for instance, recordkeeping services, plan generation services, image assembly and orchestration services, simulation and testing services, and/or other services in response to input received from one or more client devices or other computing systems.

Although computing system 240 of FIG. 2 may be a stand-alone device, one or more computing systems 240 may be implemented in any of a wide variety of ways, and may be implemented using multiple devices and/or systems. In some examples, one or more computing systems 240 may be, or may be part of, any component, device, or system that includes a processor or other suitable computing environment for processing information or executing software instructions and that operates in accordance with one or more aspects of the present disclosure. In some examples, computing system 240 may be fully implemented as hardware in one or more devices or logic elements.

In the example of FIG. 2, computing system 240 may include power source 241, one or more processors 243, one or more communication units 245, one or more input/output devices 247, and one or more storage devices 250. Storage device 250 may include recordkeeping module 252 ("RECORD"), simulation module 256 ("SIMULATE"), image factory module 258 ("IMAGE"), enterprise data store 101, application information records 103, one or more simulation plans 105, and one or more images 114. One or more of the devices, modules, storage areas, or other components of computing system 240 may be interconnected to enable inter-component communications (physically, communicatively, and/or operatively). In some examples, such connectivity may be provided by through communication channels (e.g., communication channels 242), a system bus, a network connection, an inter-process communication data structure, or any other method for communicating data.

Power source 241 may provide power to one or more components of computing system 240. In some examples, power source 241 may receive power from the primary alternative current (AC) power supply in a commercial building or data center, where some or all of an enterprise network may reside. In other examples, power source 241 may be or may include a battery.

One or more processors 243 of computing system 240 may implement functionality and/or execute instructions associated with computing system 240 or associated with one or more modules illustrated herein and/or described below. One or more processors 243 may be, may be part of, and/or may include processing circuitry that performs operations in accordance with one or more aspects of the present disclosure. Examples of processors 243 include microprocessors, application processors, display controllers, auxiliary processors, one or more sensor hubs, and any other hardware configured to function as a processor, a processing unit, or a processing device. Computing system 240 may use one or more processors 243 to perform operations in accordance with one or more aspects of the present disclosure using software, hardware, firmware, or a mixture of hardware, software, and firmware residing in and/or executing at computing system 240.

One or more communication units 245 of computing system 240 may communicate with devices external to computing system 240 by transmitting and/or receiving data, and may operate, in some respects, as both an input device and an output device. In some examples, communication unit 245 may communicate with other devices over a network. In other examples, communication units 245 may send and/or receive radio signals on a radio network such as a cellular radio network. In other examples, communication units 245 of computing system 240 may transmit and/or receive satellite signals on a satellite network such as a Global Positioning System (GPS) network. Examples of communication units 245 include a network interface card (e.g. such as an Ethernet card), an optical transceiver, a radio frequency transceiver, a GPS receiver, or any other type of device that can send and/or receive information. Other examples of communication units 245 may include devices capable of communicating over Bluetooth®, GPS, NFC, ZigBee, and cellular networks (e.g., 3G, 4G, 5G), and Wi-Fi® radios found in mobile devices as well as Universal Serial Bus (USB) controllers and the like. Such communications may adhere to, implement, or abide by appropriate protocols, including Transmission Control Protocol/Internet Protocol (TCP/IP), Ethernet, Bluetooth, NFC, or other technologies or protocols.

One or more input/output devices 247 may represent any input or output devices of computing system 240 not otherwise separately described herein. One or more input/output devices 247 may generate, receive, and/or process input from any type of device capable of detecting input from a human or machine. One or more input/output devices 247 may generate, present, and/or process output through any type of device capable of producing output.

One or more storage devices 250 within computing system 240 may store information for processing during operation of computing system 240. Storage devices 250 may store program instructions and/or data associated with one or more of the modules described in accordance with one or more aspects of this disclosure. One or more processors 243 and one or more storage devices 250 may provide an operating environment or platform for such modules, which may be implemented as software, but may in some examples include any combination of hardware, firmware, and software. One or more processors 243 may execute instructions and one or more storage devices 250 may store instructions and/or data of one or more modules. The combination of processors 243 and storage devices 250 may retrieve, store, and/or execute the instructions and/or data of one or more applications, modules, or software. Processors 243 and/or storage devices 250 may also be operably coupled to one or more other software and/or hardware components, including, but not limited to, one or more of the components of computing system 240 and/or one or more devices or systems illustrated as being connected to computing system 240.

In some examples, one or more storage devices 250 are temporary memories, meaning that a primary purpose of the one or more storage devices is not long-term storage. Storage devices 250 of computing system 240 may be configured for short-term storage of information as volatile memory and therefore not retain stored contents if deactivated. Examples of volatile memories include random access memories (RAM), dynamic random access memories (DRAM), static random access memories (SRAM), and other forms of volatile memories known in the art. Storage devices 250, in some examples, also include one or more computer-readable storage media. Storage devices 250 may be configured to store larger amounts of information than volatile memory. Storage devices 250 may further be configured for long-term storage of information as non-volatile memory space and retain information after activate/off cycles. Examples of non-volatile memories include magnetic hard disks, optical discs, floppy disks, Flash memories, or forms of electrically programmable memories (EPROM) or electrically erasable and programmable (EEPROM) memories.

Recordkeeping module 252 may perform functions relating to maintaining, updating, and interacting with enterprise data store 101. Recordkeeping module 252 may maintain enterprise data store 101 and application information records 103, and may update enterprise data store 101 and/or application information records 103 in response to input. For instance, recordkeeping module 252 may receive input from a computing device associated with one or more lines of business. Recordkeeping module 252 may determine that the input corresponds to information about one or more enterprise applications administered, developed, or updated by such lines of business. Recordkeeping module 252 may also receive input over network 206, from console 130, or from another source. Recordkeeping module 252 may update enterprise data stores 101 and/or application information records 103 as enterprise applications are modified, further developed, or otherwise evolved. Recordkeeping module 252 may update one or more application information records 103 to reflect the completion and/or results of simulations performed by cluster managers 140 and data centers 150.

Simulation module 256 may perform functions relating to creating one or more simulation plans and initiating simulations of enterprise applications. For instance, simulation module 256 may access enterprise data store 101 and/or application information records 103 and perform an analysis that results in simulation plan 105. Simulation module 256 may cause image factory module 258 to collect or generate images 114 that implement functionality needed to execute simulation plan 105. Simulation module 256 may interact with and/or negotiate with cluster managers 140 to identify one or more data centers 150 that have suitable resources for executing simulation plan 105. Simulation module 256 may initiate a simulation by causing one or more cluster managers 140 to spin up a virtualized computing environment to execute simulation plan 105.

Image factory module 258 may perform functions relating to collecting, generating, and/or modifying one or more images 114. Image factory module 258 may access one or more images 114 stored within storage device 250, or may generate new images for storage within storage device 250. Alternatively, or in addition, image factory module 258 may access one or more external and/or third party image repositories 112. Image factory module 258 may assemble and/or orchestrate multiple images 114 to construct combined image 115.

In some examples, combined image 115 may also represent a container image, and may be a relatively lightweight stand-alone executable package of software that generally includes everything needed to run it: code, runtime, system tools, system libraries, settings. Containers, as contemplated herein, may be implemented in a variety of forms, such as, for example, Docker, Kubernetes, and/or Mesos containers. A container image is useful in virtualized environments because a container execution unit (spun up from a container) will typically execute in the same way, and provide the same functionality, regardless of the computing environment on which it is deployed. Containers isolate software from its environment and surroundings, and abstract away differences between development and staging environments and help reduce conflicts that might otherwise arise between different instances of the same code executing in different infrastructure environments. In this way, system 100 may implement a microservice architecture, whereby software applications, testing functionality, and business continuity planning logic are implemented as a suite of independently deployable and modular services.

Enterprise data store 101 may represent any suitable data structure or storage medium for storing information relating to system 100 of FIG. 3 or systems, devices, or applications included within system 100 of FIG. 3. Enterprise data store 101 may be implemented within computing system 240, but may otherwise be implemented in the manner described in connection with FIG. 1. Enterprise data store 101 may be primarily updated and/or maintained by recordkeeping module 252, and may receive information about simulations performed and/or simulation results. Enterprise data store 101 may be searchable and/or categorized such that one or more modules (e.g., recordkeeping module 252, simulation module 256, image factory module 258) may provide an input requesting information from enterprise data store 101, and in response to the input, receive information stored within enterprise data store 101.

Application information records 103 may represent one or more files, records, or other storage units that include information about any changes, modifications, or updates that are made enterprise applications. Application information records 103 may be primarily maintained by recordkeeping module 252 so that each of application information records 103 includes relatively up-to-date information about its corresponding application; such information may include the types of computing resources, storage resources, network resources, or other types of resources are needed, preferred, or relied upon by each respective enterprise application. Application information records 103 may represent one or more records of information associated with one or more enterprise applications.

Simulation plan 105 may represent one or more files, records, or other storage units that include information about how to perform a simulation involving one or more enterprise applications. In some examples, simulation plan 105 may describe how to perform a failover operation, how to perform a simulation of one or more enterprise applications, and how to perform a failback operation restoring execution of one or more enterprise applications to production computing devices. An example simulation plan 105 is illustrated in FIG. 4.

Figure 5:
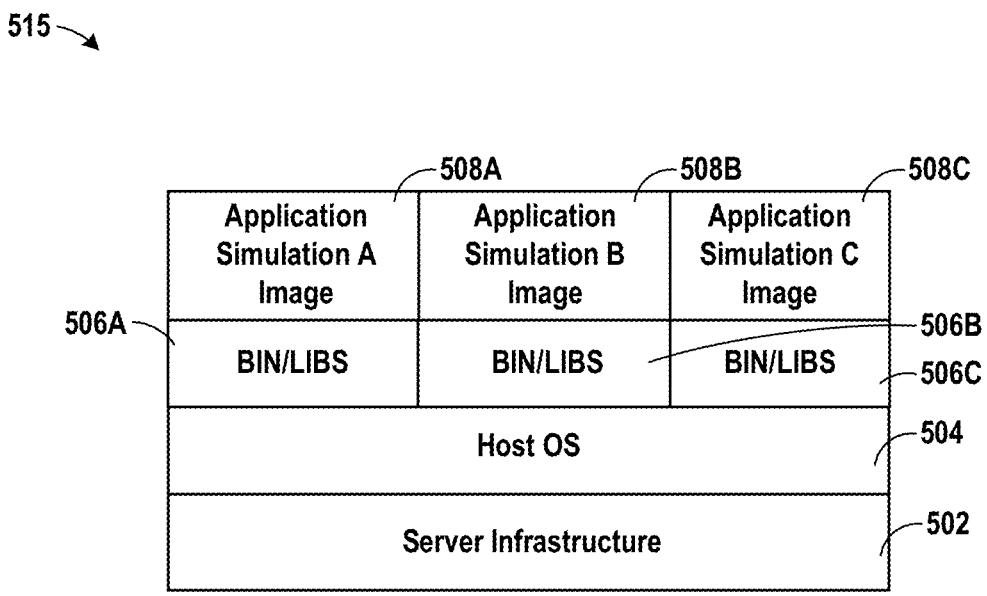
FIG. 5 illustrates a conceptual diagram of an example combined image that includes multiple images, in accordance with one or more aspects of the present disclosure.

Images 114 may represent one or more images, binary images, artifacts, source code and/or other objects that may be used by a computing system to spin up or instantiate a virtualized computing environment having specific functionality. In some examples, one or more images 114 may be a binary image of computing instructions, data, and other information that can be used to spin up various flavors of a Linux operating system virtual machine. In another example, one or more images 114 may be a binary image of computing instructions, data, and/or other information that can be used to spin up an Apache web server that might be needed to simulate one or more aspects required for a test of enterprise application 155. In a further example, one or more images 114 may be a binary image that includes simulation scripts packaged as a container file that can be used to spin up a container that executes the simulation scripts. Multiple images 114 may be combined into a combined image. An example combined image is illustrated in FIG. 5.

Images 114 may be stored in an image repository within computing system 240, or, alternatively, through an external system (e.g., image repository 112 as illustrated in FIG. 1 or FIG. 2). For example, an external image repository may include or correspond to a third party binary repository service, such as JFrog's Artifactory service (see, e.g., www.jfrog.com). However implemented, the image repository may facilitate the integration and/or combination of images and code from possibly different sources into a coherent stand-alone operating unit. In some examples, an image repository may proxy, host, and manage libraries automatically, enabling computing system 240 (or resource asset manager 120) to access the latest versions of any images 114 used by computing system 240, share those images with cluster managers 140, analyze and address any licensing issues (e.g., open source third party licenses), tag one or more images 114 with metadata, and/or purge unused images and outdated or deprecated images.

An image repository may also integrate with development and testing infrastructure. For instance, as part of the development for maintaining one or more enterprise applications, source code may typically be continuously built into binary artifacts (e.g., using a development practice often referred to as "continuous integration"). Such a development infrastructure may interact with image repository 112 to obtain images or binary artifacts from the repository and push builds to the repository (e.g., in a manner analogous to a source code repository). Tight integration between the image repository and the software development, testing, and/or continuous integration servers enables the storage of important metadata identifying, for example, which event or user triggered the build (e.g., either manually or by committing to revision control), which modules were built, which sources were used (commit id, revision, branch), the dependencies used, the environment variables implicated, and/or the packages installed.

Modules illustrated in FIG. 3 (e.g., recordkeeping module 252, simulation module 256, and image factory module 258) and/or illustrated or described elsewhere in this disclosure may perform operations described using software, hardware, firmware, or a mixture of hardware, software, and firmware residing in and/or executing at one or more computing devices. For example, a computing device may execute one or more of such modules with multiple processors or multiple devices. A computing device may execute one or more of such modules as a virtual machine executing on underlying hardware. One or more of such modules may execute as one or more services of an operating system or computing platform. One or more of such modules may execute as one or more executable programs at an application layer of a computing platform. In other examples, functionality provided by a module could be implemented by a dedicated hardware device.

Although certain modules, data stores, components, programs, executables, data items, functional units, and/or other items included within one or more storage devices may be illustrated separately, one or more of such items could be combined and operate as a single module, component, program, executable, data item, or functional unit. For example, one or more modules or data stores may be combined or partially combined so that they operate or provide functionality as a single module. Further, one or more modules may interact with and/or operate in conjunction with one another so that, for example, one module acts as a service or an extension of another module. Also, each module, data store, component, program, executable, data item, functional unit, or other item illustrated within a storage device may include multiple components, sub-components, modules, sub-modules, data stores, and/or other components or modules or data stores not illustrated.

Further, each module, data store, component, program, executable, data item, functional unit, or other item illustrated within a storage device may be implemented in various ways. For example, each module, data store, component, program, executable, data item, functional unit, or other item illustrated within a storage device may be implemented as a downloadable or pre-installed application or "app." In other examples, each module, data store, component, program, executable, data item, functional unit, or other item illustrated within a storage device may be implemented as part of an operating system executed on a computing device.

In the example of FIG. 3, and in accordance with one or more aspects of the present disclosure, computing system 240 may generate simulation plan 105. For instance, in an example that may be illustrated by FIG. 3, console 130 detects input, and outputs over network 206 an indication of input. Communication unit 245 of computing system 240 detects input and outputs to simulation module 256 information about the input. Simulation module 256 determines that the input corresponds to a request, by a user of console 130, to perform a simulation of enterprise application 155. In response, simulation module 256 accesses enterprise data store 101 and/or application information records 103 and performs an analysis. As a result of the analysis, simulation module 256 automatically generates simulation plan 105, which includes information about how a simulation of enterprise application 155 is to be performed.

Computing system 240 may assemble combined image 115. For instance, continuing with the same example, and with reference to FIG. 3, simulation module 256 causes image factory module 258 to collect one or more images that implement functionality needed to test, simulate, or otherwise perform a simulation for enterprise application 155 pursuant to simulation plan 105. When image factory module 258 performs this task, image factory module 258 may access one or more images 114 within storage device 250, which may represent images already stored in an image repository included within computing system 240. Alternatively, or in addition, image factory module 258 may generate any required images not already stored within storage device 250 as images 114.

As another alternative, image factory module 258 may access an external and/or third party image repository. For instance, image factory module 258 may cause communication unit 245 to output a signal over network 204. One or more of image repositories 112 may detect a signal and recognize the signal as a query for one or more images 114 identified within the signal. One or more image repositories 112 may respond to the signal by sending, over network 204, one or more images 114. Communication unit 245 detects a signal over network 204, and outputs to image factory module 258 an indication of the signal. Image factory module 258 determines that the signal corresponds to or includes one or more images 114. Image factory module 258 stores, within storage device 250, images 114 included within the signal. Image factory module 258 assembles each of the images 114 required to perform the simulation of enterprise application 155 into combined image 115.

Computing system 240 may cause cluster manager 140A to use combined image 115 to spin up one or more containers 145. For instance, still referring to FIG. 3, simulation module 256 causes communication unit 245 to output a signal over network 206. Cluster managers 140 receive the signal and determine that the signal corresponds to a request to determine what computing resources are available for a simulation of enterprise application 155. One or more of cluster managers 140 respond to the signal by sending, over network 206, a responsive signal. Communication unit 245 of computing system 240 detects one or more signals and outputs to simulation module 256 information about the signals. Simulation module 256 analyzes the information and determines that data center 150A currently has sufficient and/or appropriate computing resources for simulating enterprise application 155. Simulation module 256 causes communication unit 245 to output, over network 206 a signal. Cluster manager 140A detects the signal and determines that the signal includes combined image 115. Cluster manager 140A uses combined image 115 to spin up and execute container 145 corresponding to combined image 115.

Container 145 may perform a simulation and report results to computing system 240. For instance, still continuing with the same example in connection with FIG. 3, container 145 causes cluster manager 140A to interact with data center 150A to (1) perform a failover operation, (2) perform a simulation of enterprise application 155' on secondary computing devices 153A, and (3) perform a failback operation after the simulation is complete. Container 145 collects information about the results of the simulation and outputs a signal over network 206. Communication unit 245 of computing system 240 detects a signal and outputs to recordkeeping module 252 information about the signal. Recordkeeping module 252 determines that the signal includes information about the simulation of enterprise application 155. Recordkeeping module 252 causes enterprise data store 101 to store information reflecting the completion and/or results of the simulation of enterprise application 155 within data center 150A. Recordkeeping module 252 may update one or more application information records 103 reflecting the completion of the simulation of enterprise application 155. Recordkeeping module 252 may also update one or more application information records 103 to reflect the results of the simulation of enterprise application 155. Recordkeeping module 252 may further update one or more simulation plans 105, such as to reflect the results of the simulation of enterprise application 155, and/or to update a scheduling object associated with enterprise application 155.

In the example just described, simulation module 256 initiates a simulation of enterprise application 155 in response to input detected at console 130. In other examples, however, simulation module 256 may initiate a simulation of enterprise application 155 in response to input or a triggering event from a scheduling object or scheduling module within computing system 240 (not shown). In still other examples, simulation module 256 may initiate a simulation of enterprise application 155 in response to input from a scheduling object executing on another device, such as one or more cluster managers 140. Such a scheduling object may determine that enterprise application 155 is due to be tested based on information included within 101 that establishes a periodic schedule for testing one or enterprise applications. In other examples, simulation module 256 may determine that enterprise application 155 is due to be tested based on information from one or more other modules within computing system 240, or based on input or signals received from one or more cluster managers 140, each of which may execute scheduling objects associated with enterprise application 155.

FIG. 4 illustrates an example simulation plan for simulating one or more applications or application systems in accordance with one or more aspects of the present disclosure. Simulation plan 405 of FIG. 4 may be described in the context of FIG. 3 as an example of simulation plan 105. In one example, simulation plan 405 is generated by simulation module 256 of computing system 240 based on information within enterprise data store 101 (which may include, for example, application information records 103). Computing system 240 uses simulation plan 405 as the basis for interacting with image repositories 112 to cause image repositories 112 to generate each of images 114 that are required to execute simulation plan 405 within one or more of data centers 150. Computing system 240 then pushes the images 114 pertaining to simulation plan 405 to one or more of cluster managers 140 in FIG. 3, and causes one or more of cluster managers 140 to spin up a virtual computing environment the performs functions outlined in simulation plan 405. In some examples, images created from simulation plan 405 may implement and/or embody the functions defined in the plan, so that creation of an image that performs the simulation requires a sufficiently detailed plan to ensure that the image, when spun up into a computing environment, has the functionality required to execute the plan.

In the example illustrated in FIG. 4, simulation plan 405 includes five phases: pre-recovery tasks 411, recovery steps 412, validation steps 413, integrated test steps 414, and restoration steps 415. Each of these phases may be performed automatically by the virtual computing environment. In some examples, gating approval may be required to progress from the completion of one phase to initiation of the next phase. In other words, the virtual computing environment might require human verification after each of the phases before the next phase is commenced. Simulation plan 405 may include, as illustrated in FIG. 4, contact information for one or more persons that may provide gating approval. Such gating approval may be provided verbally, as a responsive email, or in another way.

Pre-recovery tasks 411 include any tasks that should be performed, or any requirements that should be met, prior to simulating the system or application associated with simulation plan 405. In some examples, one or more applications being simulated might have different requirements for transactional processing and capacity during production and during recovery, or different certificates that apply during production and during recovery. If such requirements during production and recovery are not the same, those requirements might be specified within pre-recovery tasks 411 so that computing system 240 can negotiate with cluster managers 140 to select one or more data centers 150 that has the appropriate capacity or certificate for performing the simulation corresponding to simulation plan 405. The information used to create pre-recovery tasks 411 may be derived from enterprise data store 101 or by querying each of the lines of business that use enterprise application 155 or that have developed and/or are maintaining enterprise application 155. In other words, computing system 240 may receive input that it determines is information from one or more lines of business specifying requirements pertaining to the simulation or test. In some examples, simulation plan 405 may list servers involved in a simulation of enterprise application 155 or other application under test, the steps that are processed as the enterprise application 155 is being simulated, and the aspects of the infrastructure being simulated. Pre-recovery tasks 411 may also include tasks relating to collecting pre-simulation data or snapshots from production processes to use later in validating the results of the simulation.

Recovery steps 412 includes a list of the applications that will be shut down in production during the simulation. Recovery steps 412 may provide details relating to those applications as needed to perform the shutdown. Recovery steps 412 may also provide details relating to how a system can verify that the shutdown has been successfully completed. (The term "recovery," as used in this paragraph, refers to a disaster recovery step involving, for example, switching production traffic from production computing devices 151 to secondary computing devices 153 after a disaster occurs.)

Validation steps 413 and integrated test steps 414 each include a list of steps to be performed during the simulation. Validation steps 413 may include a list of scripts that are used to perform the business validation steps and/or verify the expected outcomes. In some cases, such business validation scripts are provided by the developer of the application being simulated (e.g., the line of business responsible for the application). Integrated test steps 414 may include a list of integrated test scripts that test functionality associated with aspects of the application being simulated that are integrated with other systems. For instance, enterprise application 155 may interact with other systems and rely on functionality provided by a system outside of the functionality provided by enterprise application 155. In some cases, such integrated test scripts may also be provided by the developer of the application being simulated (e.g., the line of business responsible for the application).

Restoration steps 415 includes a list of instructions describing how to switch back to the primary equipment (e.g., production computing devices 151) from the secondary equipment (e.g., secondary computing devices 153). In some examples, this list of instructions corresponds to the same set of instructions for performing the recovery (e.g., recovery steps 412), but performed in reverse. This list may include a list of scripts that validate that the switchback was performed properly. In some examples, the list of scripts that perform this validation is provided by the line of business responsible for the application or system being tested.

FIG. 5 illustrates a conceptual diagram of an example combined image that includes multiple images, in accordance with one or more aspects of the present disclosure. In the example of FIG. 5, combined image 515 illustrates multiple images, which when deployed in a computing device, can be used as the basis for spinning up a virtualized computing environment, such as a container or virtual machine. For instance, in one example, and with reference to FIG. 3, computing system 240 receives multiple images 114 from one or more image factories 110. Each of images 114 may be selected, generated, or collected based on simulation plan 105 for enterprise application 155. Computing system 240 combines multiple images 114 into combined image 515. Computing system 240 pushes combined image 515 to one or more cluster managers 140 for execution. One or more cluster managers 140 receive combined image 515 and use combined image 515 to spin up a virtualized computing environment that performs the functions outlined in simulation plan 105, and simulates enterprise application 155. In some examples, only a single virtualized computing environment (e.g., only a single container) is created from combined image 515, even though combined image 515 may contain multiple images.

In the example of FIG. 5, combined image 515 may contain one or more host operating system images 504 on top of server infrastructure 502. In some examples, host operating system images 504 are considered base images, which often involve an image of a host operating system, such as Linux. Included within combined image 515 and conceptually on top of the base image representing the host operating system, may be one or more application images 508. Each of application images 508 may, in some cases, rely on or depend on, or execute on top of, one or more library images 506. Library images 506 may include binaries that include code corresponding to a library, an application programming interface (API) or other support functionality. In some examples, one or more library images 506 may be relied upon by only one application image 508. In other examples, one or more library images 506 may be shared by more than one application image 508. In some examples, one or more application images 508 may rely on no library images 506.

In the example of FIG. 5, and with reference to FIG. 3, image factory module 258 of computing system 240 may assemble and/or orchestrate multiple images to construct combined image 515. In some examples, image factory module 258 may itself generate one or more of host operating system image 504, library images 506, and/or application images 508. In other examples, image factory module 258 may obtain one or more of host operating system image 504, library images 506, and/or application images 508 from internal and/or external image repositories 112.

Figure 6:
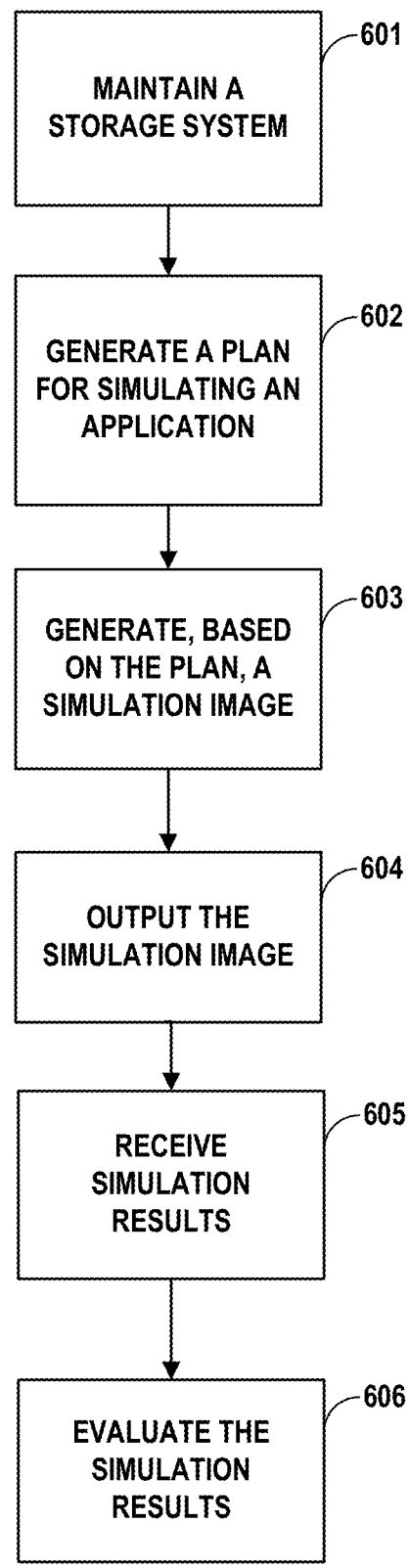
FIG. 6 is a flow diagram illustrating operations performed by an example computing system in accordance with one or more aspects of the present disclosure.

FIG. 6 is a flow diagram illustrating operations performed by an example computing system in accordance with one or more aspects of the present disclosure. FIG. 6 is described below within the context of computing system 240 of FIG. 3. In other examples, operations described in FIG. 6 may be performed by one or more other components, modules, systems, or devices. Further, in other examples, operations described in connection with FIG. 6 may be merged, performed in a difference sequence, or omitted.

In the example of FIG. 6, and in accordance with one or more aspects of the present disclosure, computing system 240 may maintain a storage system (601). For instance, in some examples, recordkeeping module 252 of computing system 240 updates enterprise data store 101 as enterprise application 155 is modified, further developed, or otherwise evolved. Recordkeeping module 252 may update application information records 103 to reflect such changes in enterprise application 155, or in response to information received from a line of business responsible for maintaining enterprise application 155.

Computing system 240 may generate a plan for simulating an application (602). For instance, in some examples, simulation module 256 of computing system 240 analyzes enterprise data store 101 and application information records 103 to determine requirements, resources, dependencies and other information relating to enterprise application 155 and a simulation of enterprise application 155. Simulation module 256 generates one or more simulation plans 105.

Computing system 240 may generate, based on the plan, a simulation image (603). For instance, in some examples, image factory module 258 may access simulation plan 105 and communicate, to image repositories 112, computing resource requirements for simulating enterprise application 155, based on simulation plan 105. In response, image repositories 112 identify one or more images 114 that will be used for simulating enterprise application 155. If the required images 114 are already available within image repositories 112, image factory module 258 accesses them within image repositories 112. If they are not included within image repositories 112, they are generated by image factory modules 258 or by a third party image factory. Image factory module 258 uses each of images 114 to generate combined image 115, which may serve as the simulation image or simulation binary. In other examples, one or more of images 114 may serve as the simulation image or simulation binary.

Computing system 240 may output the simulation image (604). For instance, in some examples, simulation module 256 of computing system 240 may cause communication unit 245 to output a signal over network 206. Cluster managers 140 detect a signal and determine that it corresponds to a request to initiate a simulation. Cluster managers 140 respond to the signal, and simulation module 256 determines that the responses include information about available resources at data centers 150. Computing system 240 and cluster managers 140 may further communicate, and computing system 240 may determine that data center 150A will perform the simulation. Computing system 240 outputs a signal over network 206. Cluster manager 140A detects the signal and determines that the signal includes combined image 115. Cluster manager 140A may spin up a container based on combined image 115, and perform the simulation within data center 150A. Cluster manager 140A may collect results and output the results over network 206.

Computing system 240 may receive simulation results (605). For instance, in some examples, communication unit 245 of computing system 240 may detect input and output to simulation module 256 information about the input. Simulation module 256 may determine that the input corresponds to simulation results from cluster manager 140A.

Computing system 240 may evaluate the simulation results (606). For instance, simulation module 256 of computing system 240 may evaluate the simulation results and update enterprise data store 101 and one or more application information records 103 with information derived from the results. In some examples, computing system 240 may evaluate the simulation results by comparing the simulation results to expected outcomes. Such outcomes might relate to one or more states associated with data center 150A, and/or outputs received from data center 150A during the test.

For processes, apparatuses, and other examples or illustrations described herein, including in any flowcharts or flow diagrams, certain operations, acts, steps, or events included in any of the techniques described herein can be performed in a different sequence, may be added, merged, or left out altogether (e.g., not all described acts or events are necessary for the practice of the techniques). Moreover, in certain examples, operations, acts, steps, or events may be performed concurrently, e.g., through multi-threaded processing, interrupt processing, or multiple processors, rather than sequentially. Further certain operations, acts, steps, or events may be performed automatically even if not specifically identified as being performed automatically. Also, certain operations, acts, steps, or events described as being performed automatically may be alternatively not performed automatically, but rather, such operations, acts, steps, or events may be, in some examples, performed in response to input or another event.

In one or more examples, the functions described may be implemented in hardware, software, firmware, or any combination thereof. If implemented in software, the functions may be stored, as one or more instructions or code, on and/or transmitted over a computer-readable medium and executed by a hardware-based processing unit. Computer-readable media may include computer-readable storage media, which corresponds to a tangible medium such as data storage media, or communication media including any medium that facilitates transfer of a computer program from one place to another (e.g., pursuant to a communication protocol). In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can include RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the terms "processor" or "processing circuitry" as used herein may each refer to any of the foregoing structure or any other structure suitable for implementation of the techniques described. In addition, in some examples, the functionality described may be provided within dedicated hardware and/or software modules. Also, the techniques could be fully implemented in one or more circuits or logic elements.

The techniques of this disclosure may be implemented in a wide variety of devices or apparatuses, including a wireless handset, a mobile or non-mobile computing device, a wearable or non-wearable computing device, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperating hardware units, including one or more processors as described above, in conjunction with suitable software and/or firmware.

What is claimed is:

1. A method comprising:
maintaining, by at least one computing system, a storage system that includes information about a plurality of application systems operating within a network, wherein for each of the application systems, the information includes information about computing resources required by the application system, dependencies relied upon by the application system, and guidelines for testing the application system;
responsive to a request, automatically generating, by the at least one computing system and based on an analysis of the information included within the storage system, a plan for simulating an application system, wherein the application system is included within the plurality of application systems;
identifying, by the at least one computing system, one or more container images for simulating the application system based on an analysis of the plan;
generating, by the at least one computing system and based on the plan, a simulation image used for instantiating the computing resources required by the application system and for simulating the application system, wherein the simulation image is based on the container images, and wherein the simulation image is further configured to perform operations comprising:
performing a failover operation for the application system,
simulating the application system, and
performing a failback operation for the application system;
identifying, by the at least one computing system, a simulation computing system to execute the simulation image;
controlling, by the at least one computing system, the simulation computing system to execute the simulation image;
and receiving, by the at least one computing system and from the simulation computing system, simulation results, wherein the simulation results are produced by a virtual computing environment generated from the simulation image and executed on the simulation computing system.

2. The method of claim 1, further comprising:
evaluating, by the at least one computing system, the simulation results; and
storing, by the at least one computing system and in the storage system, information derived from the simulation results.

3. The method of claim 1, wherein generating the simulation image includes:
generating the simulation image based on a combination of the one or more container images, wherein the one or more container images comprise at least two container images.

4. The method of claim 3, wherein generating the simulation image includes:
generating, by the at least one computing system and based on the plan, a first container image;
accessing, by the at least one computing system, a second image from a local container image repository;
and obtaining, by the at least one computing system, a third container image from an external image repository, wherein the first image, the second image, and the third image are each included within the one or more container images.

5. The method of claim 1, further comprising:
identifying, by the at least one computing system and based on the plan, a data center having resources to simulate the application system, wherein the data center is used as the simulation computing system.

6. The method of claim 5, wherein identifying the simulation computing system to execute the simulation image includes:
outputting the simulation image to the data center.

7. The method of claim 1, wherein the storage system includes a system of record within an enterprise network.

8. A system comprising:
a storage device;
and processing circuitry having access to the storage device and configured to:
maintain a storage system that includes information about a plurality of application systems operating within a network, wherein for each of the application systems, the information includes information about computing resources required by the application system, dependencies relied upon by the application system, and guidelines for testing the application system;
automatically generate, responsive to a request and based on an analysis of the information included within the storage system, a plan for simulating an application system, wherein the application system is included within the plurality of application systems:
identify one or more container images for simulating the application system based on an analysis of the plan;
generate, based on the plan, a simulation image used for instantiating the computing resources required by the application system and for simulating the application system, wherein the simulation image is based on the container images, and wherein the simulation image is further configured to perform operations comprising:
performing a failover operation for the application system,
simulating the application system, and
performing a failback operation for the application system;
identify a simulation computing system to execute the simulation image;
control the simulation computing system to execute the simulation image; and
receive, from the simulation computing system, simulation results, wherein the simulation results are produced by a virtual computing environment generated from the simulation image and executed on the simulation computing system.

9. The system of claim 8, wherein the instructions, when executed, further configure the processing circuitry to:
evaluate the simulation results; and
store, in the storage system, information derived from the simulation results.

10. The system of claim 8, wherein the instructions that configure the processing circuitry to generate the simulation image include instructions that, when executed, configure the processing circuitry to:
generate the simulation image based on a combination of the one or more container images, wherein the one or more container images comprise at least two container images.

11. The system of claim 10, wherein the instructions that configure the processing circuitry to generate the simulation image include instructions that, when executed, configure the processing circuitry to:
generate, based on the plan, a first container image;
access a second container image from a local image repository;
and obtain a third container image from an external image repository, wherein the first image, the second image, and the third image are each included within the one or more container images.

12. The system of claim 8, wherein the instructions, when executed, further configure the processing circuitry to:
identify, based on the plan, a data center having resources to simulate the application system, wherein the data center is used as the simulation computing system.

13. The system of claim 12, wherein the instructions that configure the processing circuitry to identify the simulation computing system include instructions that, when executed, configure the processing circuitry to:
output the simulation image to the data center.

14. The system of claim 8, wherein the storage system includes a system of record within an enterprise network.

15. A non-transitory computer-readable storage medium comprising instructions that, when executed, configure processing circuitry of at least one computing system to:
maintain a storage system that includes information about a plurality of application systems operating within a network, wherein for each of the application systems, the information includes information about computing resources required by the application system, dependencies relied upon by the application system, and guidelines for testing the application system;
automatically generate, responsive to a request and based on an analysis of the information included within the storage system, a plan for simulating an application system, wherein the application system is included within the plurality of application systems;
identify one or more container images for simulating the application system based on an analysis of the plan;
generate, based on the plan, a simulation image used for instantiating the computing resources required by the application system and for simulating the application system, wherein the simulation image is based on the container images, and wherein the simulation image is further configured to perform operations comprising:
performing a failover operation for the application system,
simulating the application system, and
performing a failback operation for the application system;
identify a simulation computing system to execute the simulation image;
control the simulation computing system to execute the simulation image;
and receive, from the simulation computing system, simulation results, wherein the simulation results are produced by a virtual computing environment generated from the simulation image and executed on the simulation computing system.

16. The computer-readable storage medium of claim 15, wherein the instructions, when executed, further configure the processing circuitry to:
evaluate the simulation results; and
store, in the storage system, information derived from the simulation results.

17. The computer-readable storage medium of claim 15, wherein the instructions that configure the processing circuitry to generate the simulation image include instructions that, when executed, configure the processing circuitry to:

generate the simulation image based on a combination of the one or more container images, wherein the one or more container images comprise at least two container images.

18. The computer-readable storage medium of claim 17, wherein the instructions that configure the processing circuitry to generate the simulation image include instructions that, when executed, configure the processing circuitry to:
   generate, based on the plan, a first container image;
   access a second container image from a local image repository;
   and obtain a third container image from an external image repository, wherein the first image, the second image, and the third image are each included within the one or more container images.

19. The computer-readable storage medium of claim 15, wherein the instructions, when executed, further configure the processing circuitry to:
   identify, based on the plan, a data center having resources to simulate the application system, wherein the data center is used as the simulation computing system.

20. The computer-readable storage medium of claim 19, wherein the instructions that configure the processing circuitry to identify the simulation computing system include instructions that, when executed, configure the processing circuitry to:
   output the simulation image to the data center.

* * * * *